United States Patent
Saito

(10) Patent No.: US 12,119,396 B2
(45) Date of Patent: Oct. 15, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Yasunobu Saito, Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 200 days.

(21) Appl. No.: 17/494,639

(22) Filed: Oct. 5, 2021

(65) Prior Publication Data

US 2022/0029006 A1    Jan. 27, 2022

Related U.S. Application Data

(62) Division of application No. 16/287,394, filed on Feb. 27, 2019, now abandoned.

(30) Foreign Application Priority Data

Sep. 18, 2018   (JP) ................ 2018-173396

(51) Int. Cl.
    *H01L 29/778*    (2006.01)
    *H01L 29/423*    (2006.01)

(52) U.S. Cl.
    CPC ...... *H01L 29/7783* (2013.01); *H01L 29/4236* (2013.01); *H01L 29/7786* (2013.01); *H01L 29/7787* (2013.01)

(58) Field of Classification Search
    CPC .................. H01L 29/7787; H01L 29/7786
    See application file for complete search history.

(56) References Cited

U.S. PATENT DOCUMENTS

| | | | |
|---|---|---|---|
| 8,148,752 B2 | 4/2012 | Ikoshi et al. | |
| 10,014,399 B1 | 7/2018 | Kawai | |

(Continued)

FOREIGN PATENT DOCUMENTS

| | | |
|---|---|---|
| CN | 105097911 A | 11/2015 |
| JP | 2009218566 A | 9/2009 |

(Continued)

OTHER PUBLICATIONS

Hsieh, T-E "Gate Recessed Quasi-Normally off Al2O3/AlGaN/GaN MIS-HEMT With Low Threshold Voltage Hysteresis Using PEALD AlN Interfacial Passivation Layer" IEEE Elec. Dev. Lett. vol. 35, No. 7 Jul. 2014 pp. 732-734 (Year: 2014).*

(Continued)

*Primary Examiner* — Grant S Withers
(74) *Attorney, Agent, or Firm* — Kim & Stewart LLP

(57) ABSTRACT

According to one embodiment, a semiconductor device comprises a first nitride semiconductor layer on a substrate and a second nitride semiconductor layer on the first nitride semiconductor layer. The second nitride semiconductor layer has a larger bandgap than the first nitride semiconductor layer. Source and drain electrodes are on the second nitride semiconductor layer. A gate electrode is between the source electrode and the drain electrode. A third nitride semiconductor layer of p-type conductivity is on the second nitride semiconductor layer between the drain electrode and the gate electrode and spaced from the drain electrode.

20 Claims, 6 Drawing Sheets

(56) References Cited

U.S. PATENT DOCUMENTS

| | | |
|---|---|---|
| 2003/0157776 A1 | 8/2003 | Smith |
| 2005/0189559 A1 | 9/2005 | Saito et al. |
| 2007/0278518 A1 | 12/2007 | Chen et al. |
| 2009/0200576 A1 | 8/2009 | Saito et al. |
| 2013/0075752 A1 | 3/2013 | Kotani |
| 2013/0099285 A1* | 4/2013 | Hwang .............. H01L 29/1608 257/E29.246 |
| 2013/0248874 A1 | 9/2013 | Kuraguchi |
| 2014/0264441 A1 | 9/2014 | Murase |
| 2015/0270355 A1 | 9/2015 | Kuraguchi et al. |
| 2015/0270379 A1 | 9/2015 | Kuraguchi et al. |
| 2016/0020313 A1 | 1/2016 | Wu et al. |
| 2016/0172473 A1 | 6/2016 | Suzuki et al. |
| 2016/0172474 A1 | 6/2016 | Miyake et al. |
| 2018/0026124 A1 | 1/2018 | Shimizu et al. |
| 2018/0061974 A1 | 3/2018 | Saito et al. |

FOREIGN PATENT DOCUMENTS

| | | |
|---|---|---|
| JP | 2013074070 A | 4/2013 |
| JP | 2014041965 A | 3/2014 |
| JP | 2015179785 A | 10/2015 |
| JP | 2016115931 A | 6/2016 |
| JP | 2017139338 A | 8/2017 |
| JP | 2018022870 A | 2/2018 |
| JP | 2018037435 A | 3/2018 |

OTHER PUBLICATIONS

Guo Dechun et al., "A simulation about the influence of the Gate-Source-Drain distance on the AlGaN/GaN HEMT performance at Ka-band", 2012 IEEE Microw. Workshop Ser. Millimeter Wave Wireless Technol. Appl. (IMWS) Oct. 25, 2012, pp. 1-4.

* cited by examiner

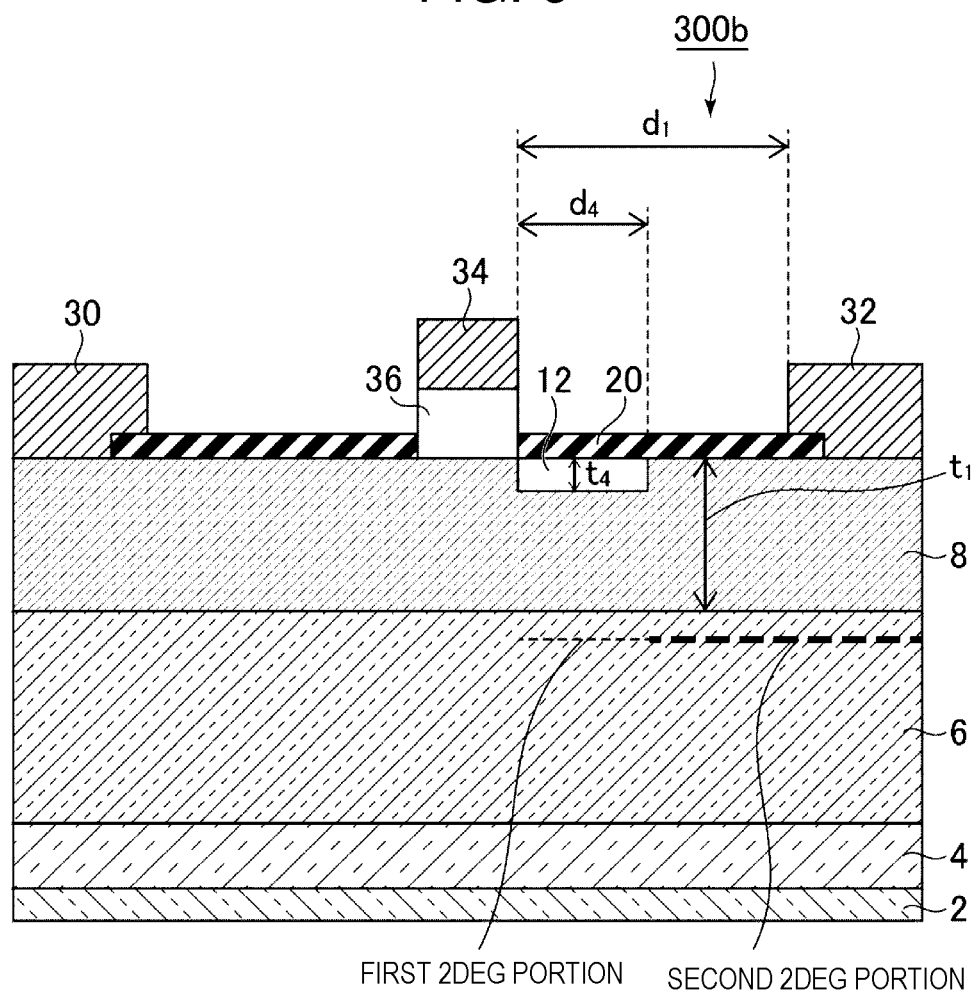

SEMICONDUCTOR DEVICE

CROSS-REFERENCE TO RELATED APPLICATIONS

This application is a division of U.S. patent application Ser. No. 16/287,394, filed on Feb. 27, 2019, which is based upon and claims the benefit of priority from Japanese Patent Application No. 2018-173396, filed Sep. 18, 2018, the entire contents of each of which are incorporated herein by reference.

FIELD

Embodiments described herein relate generally to a semiconductor device.

BACKGROUND

A low ON-state resistance and a high breakdown voltage are both preferred for a switching device used in, for example, an inverter circuit and power source switching. Silicon is mainly used as a semiconductor material for these switching devices, but the limits of silicon for achieving a lower ON-state resistance and a higher breakdown voltage are approaching or have already been reached. To improve the breakdown voltage and decrease the ON-state resistance to further degrees, it is considered necessary to change the semiconductor material. Use of nitride semiconductor materials, such as GaN and AlGaN, improves the trade-off relationship between ON-state resistance and breakdown voltage, which are largely dependent on the semiconductor material being used.

In the operation of a switching device, an ON state and an OFF state are repeatedly switched back and forth. In the OFF state, a high voltage is applied across a source electrode and a drain electrode. At this time, a depletion layer extends from a gate electrode toward the drain electrode. When the depletion layer reaches the drain electrode a state called "punch-through" is entered and the depletion layer stops extending. This drastically changes capacitance, which unfortunately causes current oscillation. At a portion where the drain electrode overlaps a surface protection film, electrons are trapped at an interface between the nitride semiconductor material and the surface protection film or within the surface protection film to unfavorably increase the ON-state resistance.

DESCRIPTION OF THE DRAWINGS

FIG. 6 is a schematic cross-sectional view of a semiconductor device according to another example of the third embodiment.

DETAILED DESCRIPTION

Figure 1:
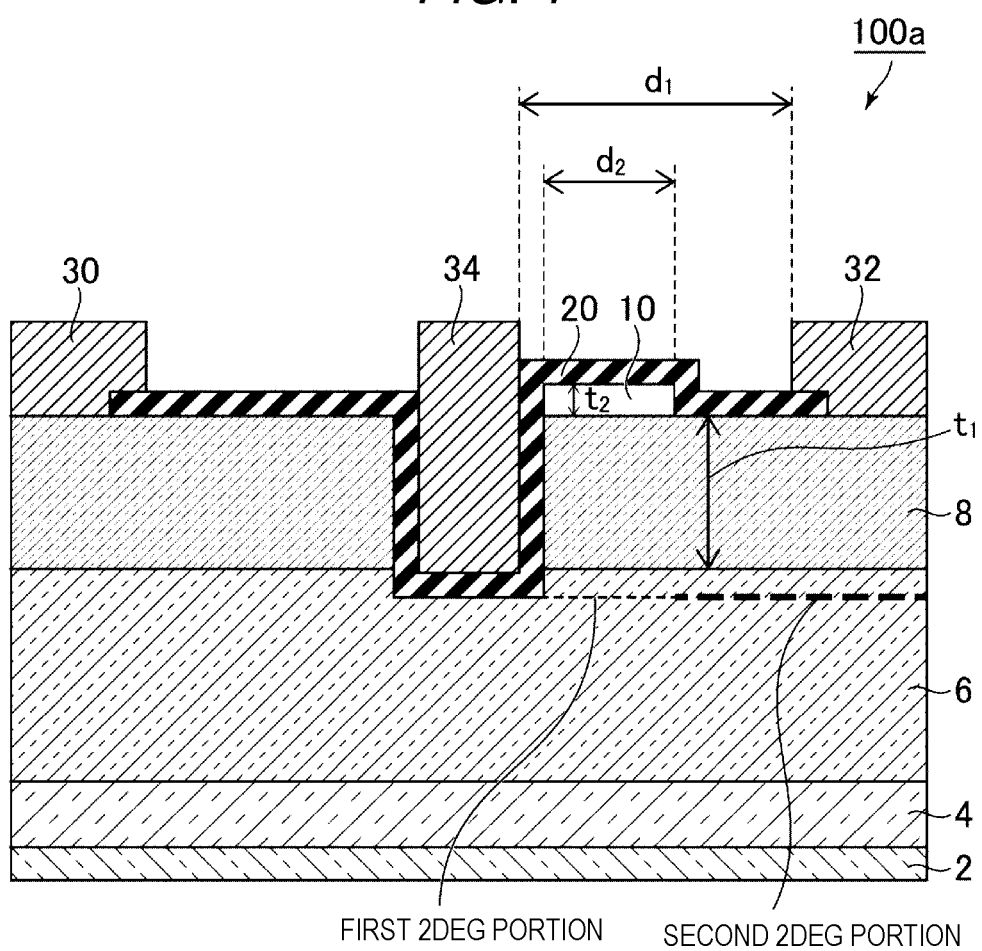
FIG. 1 is a schematic cross-sectional view of a semiconductor device according to a first embodiment.

Example embodiments provide a semiconductor device that prevents current oscillation from occurring during switching and prevents the trapping of electrons from increasing the ON-state resistance.

In general, according to one embodiment, a semiconductor device includes a first nitride semiconductor layer on a substrate and a second nitride semiconductor layer on the first nitride semiconductor layer. The second nitride semiconductor layer has a larger bandgap than the first nitride semiconductor layer. Source and drain electrodes are on the second nitride semiconductor layer. A gate electrode is between the source electrode and the drain electrode. A third nitride semiconductor layer of p-type conductivity is on the second nitride semiconductor layer between the drain electrode and the gate electrode and is spaced from the drain electrode.

Example embodiments will now be described with reference to the accompanying drawings. In the drawings, identical or corresponding elements are given the same reference numerals.

In this disclosure, "nitride semiconductors" will generally refer to gallium nitride (GaN), aluminum nitride (AlN), indium nitride (InN) based semiconductors and other semiconductors materials including intermediate compositions of GaN, AlN, and InN.

In this specification, corresponding elements and the like are given the same reference numerals and description of such elements may not be made repeatedly.

In this specification, to indicate positional relationships among components, an upward direction of each drawing will be referred to as "upper", and a downward direction of each drawing will be referred to as "lower". In this specification, concepts of the terms "upper" and "lower" do not necessarily concern the gravity direction.

First Embodiment

A semiconductor device according to a first embodiment includes a substrate, a first nitride semiconductor layer disposed on the substrate, a second nitride semiconductor layer disposed on the first nitride semiconductor layer and having a larger bandgap than the first nitride semiconductor layer, a source electrode disposed on the second nitride semiconductor layer, a drain electrode disposed on the second nitride semiconductor layer, a gate electrode disposed between the source electrode and the drain electrode, and a third nitride semiconductor layer of p-type conductivity disposed on the second nitride semiconductor layer between the drain electrode and the gate electrode and spaced from the drain electrode.

FIG. 1 is a schematic cross-sectional view of a semiconductor device 100a according to the first embodiment. The semiconductor device 100a according to this embodiment is a high electron mobility transistor (HEMT) of nitride semiconductor.

The semiconductor device 100a includes a substrate 2, a buffer layer 4, a first nitride semiconductor layer 6, a second nitride semiconductor layer 8, a third nitride semiconductor layer 10, an insulating film 20, a source electrode 30, a drain electrode 32, and a gate electrode 34.

As the substrate 2, a silicon (Si) substrate, a silicon carbide (SiC) substrate, or a sapphire ($Al_2O_3$) substrate is preferably used.

The first nitride semiconductor layer 6 is disposed on the substrate 2. The first nitride semiconductor layer 6 is made of, for example, undoped $Al_XGa_{1-X}N$ ($0 \leq X < 1$). More specifically, examples include undoped GaN. The first nitride semiconductor layer 6 has a thickness of, for example, between 0.5 μm and 3 μm.

The second nitride semiconductor layer 8 is disposed on the first nitride semiconductor layer 6 and has a larger bandgap than the first nitride semiconductor layer 6. The second nitride semiconductor layer 8 is made of, for example, undoped $Al_YGa_{1-Y}N$ (0<Y≤1, X<Y). The second nitride semiconductor layer 8 has a thickness $t_1$ of, for example, 15 nm to 50 nm.

A two-dimensional electron gas (hereinafter referred to as 2DEG) is generated at a hetero-bond interface between the first nitride semiconductor layer 6 and the second nitride semiconductor layer 8.

The buffer layer 4 is disposed between the substrate 2 and the first nitride semiconductor layer 6. The buffer layer 4 serves to reduce lattice mismatch between the substrate 2 and the first nitride semiconductor layer 6. The buffer layer 4 has, for example, a multilayer structure of aluminum gallium nitride ($Al_WGa_{1-W}N$ (0<W<1)).

The source electrode 30 is disposed on the second nitride semiconductor layer 8.

The drain electrode 32 is disposed on the second nitride semiconductor layer 8.

The source electrode 30 and the drain electrode 32 are preferably in ohmic contact with the second nitride semiconductor layer 8. A distance between the source electrode 30 and the drain electrode 32 is, for example, 5 μm or more and 30 μm or less.

The gate electrode 34 is disposed between the source electrode 30 and the drain electrode 32. The semiconductor device 100a illustrated in FIG. 1 has what is referred to as a trench structure. In other words, the portion of the second nitride semiconductor layer 8 between the gate electrode 34 and the first nitride semiconductor layer 6 is removed, and the gate electrode 34 is extended into part of the first nitride semiconductor layer 6. With this structure, 2DEG is not generated right under the gate electrode 34. Consequently, the semiconductor device 100a is what is called a normally-off semiconductor device. It is noted that the gate electrode 34 is not limited to the structure illustrated in FIG. 1 but may have a structure in which, for example, part of the second nitride semiconductor layer 8 remains between the gate electrode 34 and the first nitride semiconductor layer 6.

The source electrode 30, the drain electrode 32, and the gate electrode 34 are metal electrodes of, for example, a stacked structure of titanium (Ti) and aluminum (Al) or a stacked structure of nickel (Ni) and gold (Au).

The third nitride semiconductor layer 10 is disposed on the second nitride semiconductor layer 8 between the drain electrode 32 and the gate electrode 34 and spaced from the drain electrode 32. The third nitride semiconductor layer 10 has p-type conductivity. The third nitride semiconductor layer 10 contains magnesium (Mg), beryllium (Be), carbon (C) or zinc (Zn) as a p-type impurity. Preferably, the p-type impurity in the third nitride semiconductor layer 10 has a concentration in a range of $10^{19}$ cm$^{-3}$ to $10^{21}$ cm$^{-3}$, in which the third nitride semiconductor layer material has a Fermi level close to the valence band and has a crystallinity not significantly deteriorated.

Because the third nitride semiconductor layer 10 has p-type conductivity, the third nitride semiconductor layer 10 functions to lower a Fermi level in the vicinity of an interface between the first nitride semiconductor layer 6 and the second nitride semiconductor layer 8 below the third nitride semiconductor layer 10 so as to decrease a 2DEG concentration. Consequently, a first 2DEG portion of a relatively low concentration is formed in the vicinity of the interface between the first nitride semiconductor layer 6 and the second nitride semiconductor layer 8 below the third nitride semiconductor layer 10. On the right side of an area where the first 2DEG portion is formed in FIG. 1, a second 2DEG portion of a relatively high concentration is formed.

Preferably, a distance $d_1$ between the drain electrode 32 and the gate electrode 34 and a length $d_2$ of the third nitride semiconductor layer 10 in a direction parallel to a plane of the substrate 2 have a difference in a range represented by 0.5 μm≤$d_1$−$d_2$≤2 μm. The device is designed to have a breakdown voltage at such a value that the depletion layer extends as long as the length $d_2$. The 2DEG concentration in an area where the depletion layer exceeds the length $d_2$ (i.e., the second 2DEG portion) is increased to prevent the depletion layer from further extending from this area. This prevents punch-through to the drain electrode 32 and smooths any change in capacitance. When the difference $d_1$−$d_2$ (i.e., the second 2DEG portion) is too long, dimensions of the device become too large, and when the difference $d_1$−$d_2$ is too short, the effect of preventing the punch-through is too small. In view of this, preferably, the difference $d_1$−$d_2$ is in the above-mentioned range.

Preferably, the third nitride semiconductor layer 10 has a thickness $t_2$ of 40 nm or less so as to not to make the 2DEG concentration in the first 2DEG portion too low. Supposing that the third nitride semiconductor layer 10 is prepared to have the above-mentioned concentration, then if the thickness $t_2$ exceeds 40 nm and the thickness $t_1$ is in the above-mentioned range, the concentration of 2DEG induced below (in the first 2DEG portion) is drastically decreased to sharply increase the resistance in this portion. This results in an increase in ON-state resistance of the device, thereby degrading properties of the device. In view of this, the thickness $t_2$ of the third nitride semiconductor layer 10 is preferably 40 nm or less.

The insulating film 20 is disposed on the second nitride semiconductor layer 8. The insulating film 20 is a surface protection film to protect the nitride semiconductor material. In the semiconductor device 100a illustrated in FIG. 1, part of the insulating film 20 also serves as a gate insulating film.

In FIG. 1, part of the source electrode 30 is in direct contact with the second nitride semiconductor layer 8. Between the gate electrode 34 and a portion where the source electrode 30 is indirect contact with the second nitride semiconductor layer 8, the insulating film 20 is disposed in a portion between the second nitride semiconductor layer 8 and the source electrode 30. This structure protects an upper surface of the second nitride semiconductor layer 8 in the vicinity of the source electrode 30.

The insulating film 20 is disposed between the gate electrode 34 and the second nitride semiconductor layer 8 and between the gate electrode 34 and the first nitride semiconductor layer 6. Between the drain electrode 32 and the gate electrode 34, the insulating film 20 is formed to cover the third nitride semiconductor layer 10.

Part of the drain electrode 32 is in direct contact with the second nitride semiconductor layer 8. Between the gate electrode 34 and a portion where the drain electrode 32 is indirect contact with the second nitride semiconductor layer 8, the insulating film 20 is disposed in a portion between the second nitride semiconductor layer 8 and the drain electrode 32. This structure protects the upper surface of the second nitride semiconductor layer 8 in the vicinity of the drain electrode 32.

The insulating film 20 contains, for example, silicon nitride (SiN) or silicon oxide ($SiO_2$).

Figure 2:
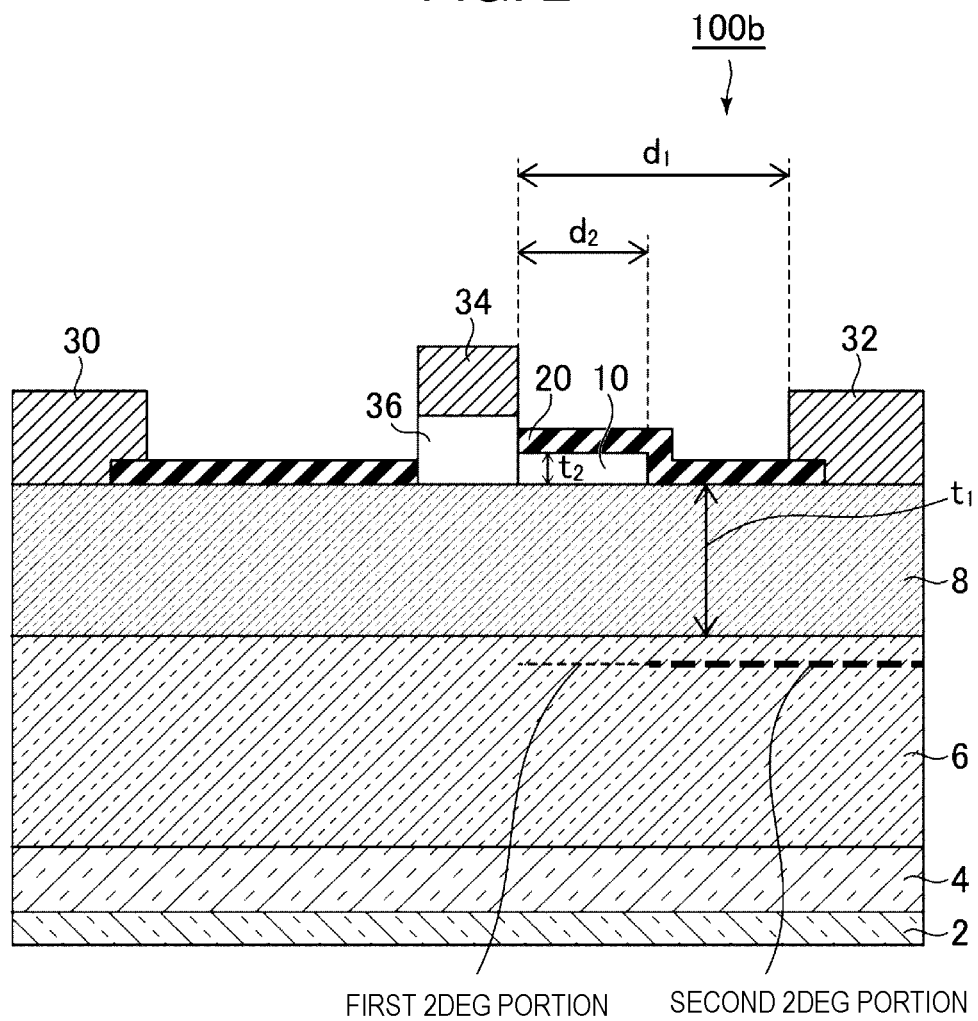
FIG. 2 is a schematic cross-sectional view of a semiconductor device according to another example of the first embodiment.

FIG. 2 is a schematic cross-sectional view of a semiconductor device 100b according to another example of the first embodiment. The semiconductor device 100b has no trench structure. In the semiconductor device 100b, a p-type cap layer 36 is disposed between the gate electrode 34 and the second nitride semiconductor layer 8. The cap layer 36 is in direct contact with the third nitride semiconductor layer 10.

The cap layer 36 functions to lower a Fermi level in the vicinity of the interface between the first nitride semiconductor layer 6 and the second nitride semiconductor layer 8 below the cap layer 36 to make the 2DEG disappear, thus causing the semiconductor device 100b to be normally off. The cap layer 36 is a nitride semiconductor material containing magnesium (Mg), beryllium (Be), carbon (C) or zinc (Zn) as a p-type impurity. Preferably, the p-type impurity in the cap layer 36 has a concentration of $10^{19}$ cm$^{-3}$ or more and $10^{21}$ cm$^{-3}$ or less. In some examples, the cap layer 36 and the third nitride semiconductor layer 10 may comprise the same material type.

Next, functions and effects of this first embodiment will be described.

In this first embodiment, the third nitride semiconductor layer 10 of p-type conductivity is disposed on the second nitride semiconductor layer 8 between the drain electrode 32 and the gate electrode 34 and spaced from the drain electrode 32. With this structure, the 2DEG concentration in the second 2DEG portion closer to the drain electrode 32 is made higher than the 2DEG concentration in the first 2DEG portion closer to the gate electrode 34. Thus, in an OFF state, an area of the depletion layer as well as a reverse voltage is increased relatively drastically in the area where the first 2DEG portion is formed. Meanwhile, an area of the depletion layer as well as a reverse voltage is increased relatively moderately in the area where the second 2DEG portion is formed. Consequently, while the area where the first 2DEG portion is formed is used to increase the breakdown voltage of the semiconductor device, the area where the second 2DEG portion is formed is used to make the capacitance of the depletion layer in the OFF state change moderately. This prevents occurrence of what is called punch-through and also prevents occurrence of current oscillation.

When the punch-through occurs, electrons are trapped at the portion where the insulating film 20 is disposed between the second nitride semiconductor layer 8 and the drain electrode 32, thereby unfortunately increasing an ON-state resistance. However, the concentration in the second 2DEG portion is increased to prevent the punch-through so that an influence of trapping of electrons can be made relatively small. As a result, the ON-state resistance can be prevented from increasing.

Formation of the second 2DEG portion prevents current oscillation from occurring at the time of switching and prevents the trapping of electrons from increasing ON-state resistance. To further improve such prevention effects, preferably, the distance $d_1$ between the drain electrode 32 and the gate electrode 34 and the length $d_2$ of the third nitride semiconductor layer 10 in the direction parallel to the substrate plane have a difference in a range represented by $0.5 \ \mu m \leq d_1 - d_2 \leq 2 \ \mu m$. Preferably, the thickness $t_2$ of the third nitride semiconductor layer 10 is 40 nm or less so the concentration in the first 2DEG portion is not made too low.

The structure of the gate electrode 34 is described with reference to FIGS. 1 and 2. However, the structure of the gate electrode 34 is not limited to these examples of the first embodiment. The gate electrode 34 may have, for example, a Schottky structure in which the gate electrode 34 is in direct contact with the second nitride semiconductor layer 8.

This first embodiment can provide a semiconductor device that prevents current oscillation from occurring during switching and prevents the trapping of electrons from increasing ON-state resistance.

Second Embodiment

A semiconductor device according to a second embodiment includes a substrate, a first nitride semiconductor layer disposed on the substrate, a source electrode disposed on the first nitride semiconductor layer, a drain electrode disposed on the first nitride semiconductor layer, a gate electrode disposed between the source electrode and the drain electrode, a second nitride semiconductor layer disposed between the first nitride semiconductor layer and the drain electrode and having a larger bandgap than the first nitride semiconductor layer, a third nitride semiconductor layer disposed on the first nitride semiconductor layer between the gate electrode and the drain electrode and on a side of the second nitride semiconductor layer, the third nitride semiconductor layer having a larger bandgap than the first nitride semiconductor layer and a smaller bandgap than the second nitride semiconductor layer, and a fourth nitride semiconductor layer disposed between the first nitride semiconductor layer and the source electrode and having a larger bandgap than the first nitride semiconductor layer and the third nitride semiconductor layer.

The explanation of aspects of the second embodiment which overlap the first embodiment will not be repeated.

Figure 3:
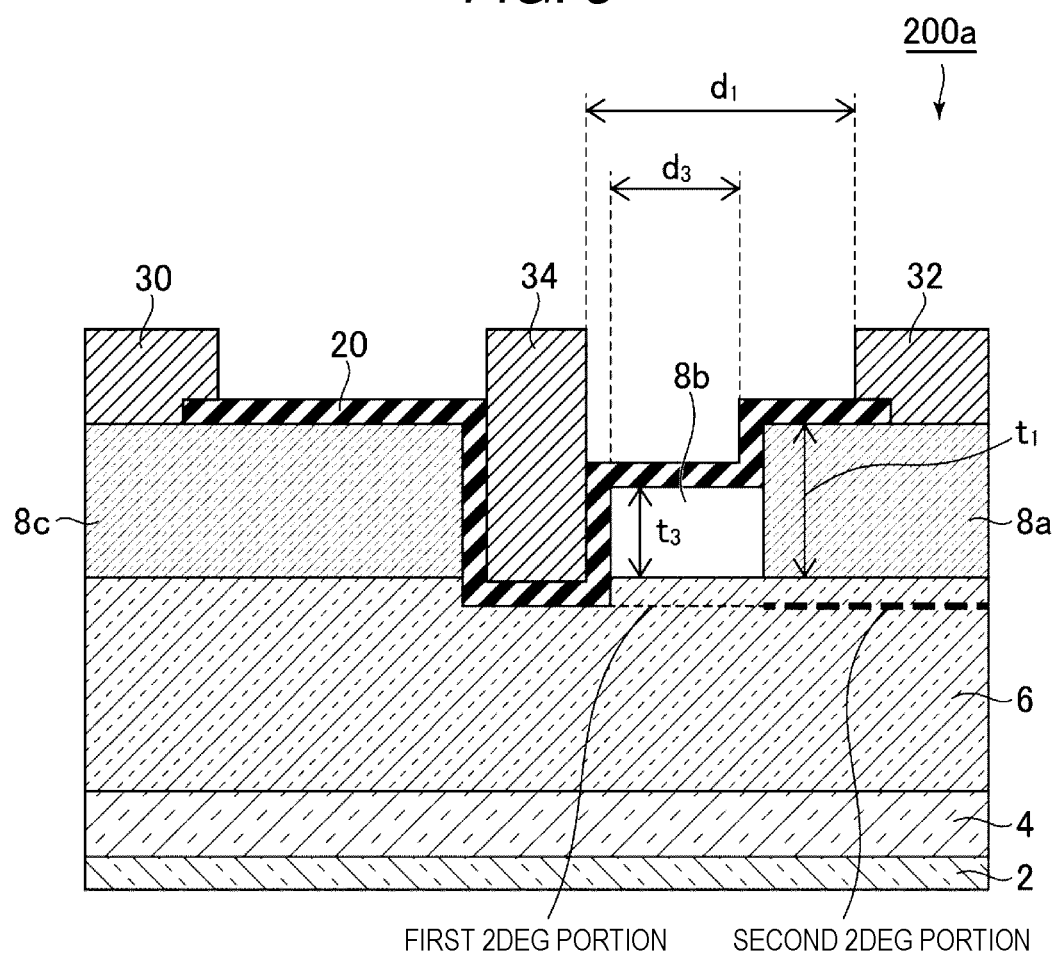
FIG. 3 is a schematic cross-sectional view of a semiconductor device according to a second embodiment.

FIG. 3 is a schematic cross-sectional view of a semiconductor device 200a according to the second embodiment.

A second nitride semiconductor layer 8a is disposed between the first nitride semiconductor layer 6 and the drain electrode 32 and has a larger bandgap than the first nitride semiconductor layer 6. Specifically, the second nitride semiconductor layer 8a is made of, for example, undoped $Al_YGa_{1-Y}N$ ($0<Y\leq1$, $X<Y$). The second nitride semiconductor layer 8a has a thickness $t_1$ of, for example, 15 nm to 50 nm.

To form the second 2DEG portion having a higher concentration than the first 2DEG portion, the second nitride semiconductor layer 8a may contain silicon (Si) as an n-type impurity.

A third nitride semiconductor layer 8b is disposed on the first nitride semiconductor layer 6 between the gate electrode 34 and the drain electrode 32 and on a side of the second nitride semiconductor layer 8a. The third nitride semiconductor layer 8b has a larger bandgap than the first nitride semiconductor layer 6 and a smaller bandgap than the second nitride semiconductor layer 8a. Specifically, the third nitride semiconductor layer 8b is made of, for example, undoped $Al_ZGa_{1-Z}N$ ($0<Z\leq1$, $X<Z\leq Y$). The third nitride semiconductor layer 8b has a thickness $t_3$ of, for example, 15 nm to 30 nm. A ratio $t_1/t_3$ of the thickness $t_1$ of the second nitride semiconductor layer 8a to the thickness $t_3$ of the third nitride semiconductor layer 8b is in a range of 1 to 1.7. Preferably, the distance $d_1$ between the drain electrode 32 and the gate electrode 34 and a length $d_3$ of the third nitride semiconductor layer 8b in the direction parallel to the substrate plane between the drain electrode 32 and the gate electrode 34 have a difference in a range represented by $0.5 \ \mu m \leq d_1 - d_3 \leq 2 \ \mu m$.

A fourth nitride semiconductor layer 8c is disposed between the first nitride semiconductor layer 6 and the source electrode 30 and has a larger bandgap than the first nitride semiconductor layer 6 and the third nitride semiconductor layer 8b. Specifically, the fourth nitride semiconductor layer 8c is made of, for example, undoped $Al_YGa_{1-Y}N$ ($0<Y\leq1$, $X<Y$).

Figure 4:
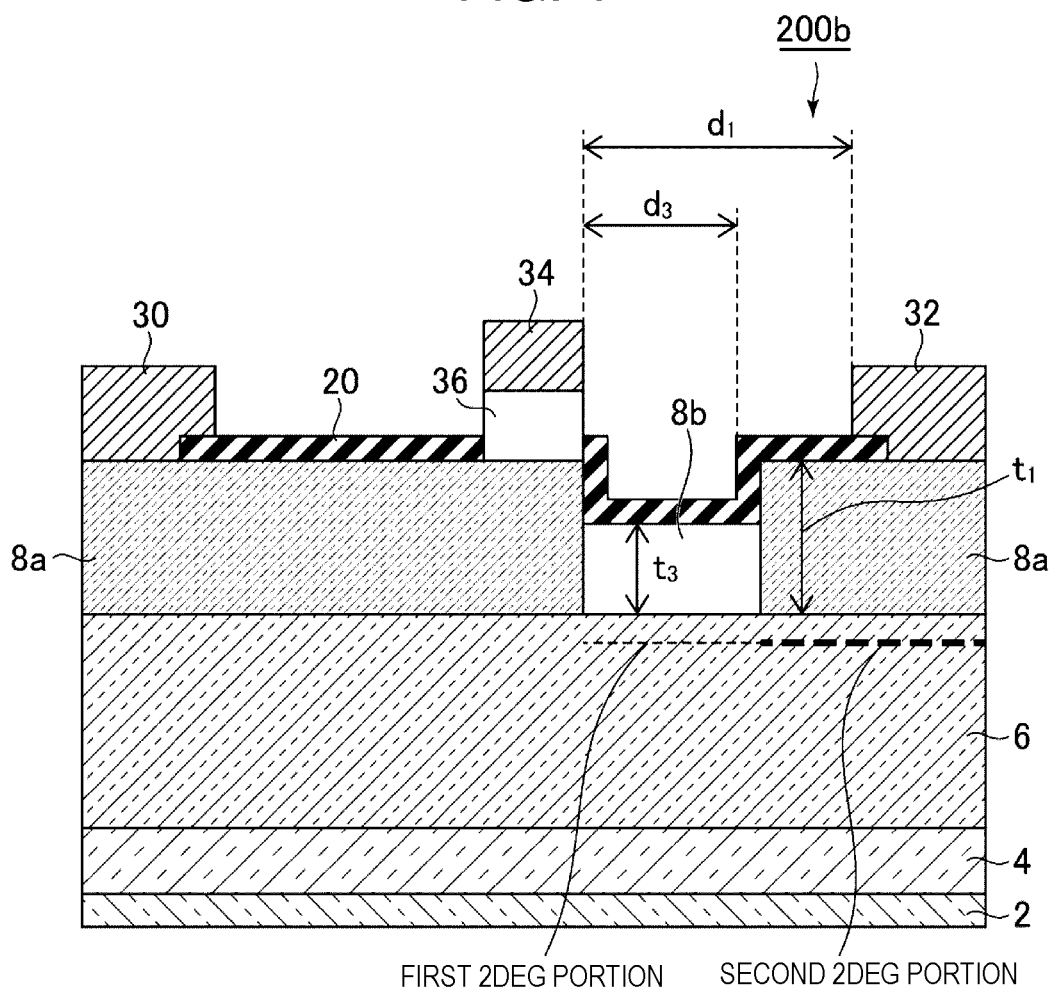
FIG. 4 is a schematic cross-sectional view of a semiconductor device according to another example of the second embodiment.

FIG. 4 is a schematic cross-sectional view of a semiconductor device 200b according to another example of the second embodiment. The semiconductor device 200b is substantially the same as the semiconductor device 200a illustrated in FIG. 3 except for a structure of the gate electrode 34 and surrounding elements that is similar to the structure illustrated in FIG. 2.

In a similar manner to the first embodiment, the first 2DEG portion is formed in the vicinity of an interface between the first nitride semiconductor layer 6 and the third nitride semiconductor layer 8b under the third nitride semiconductor layer 8b. The second 2DEG portion having a relatively high 2DEG concentration is formed in the vicinity of an interface between the first nitride semiconductor layer 6 and the second nitride semiconductor layer 8a under the second nitride semiconductor layer 8a. Consequently, in a similar manner to the first embodiment, the second embodiment can provide the semiconductor device that prevents current oscillation from occurring during switching and prevents the trapping of electrons from increasing ON-state resistance.

Formation of the first 2DEG portion prevents current oscillation from occurring during switching and prevents the trapping of electrons from increasing ON-state resistance. To further improve such preventive effects, the second 2DEG portion preferably has a higher concentration than the first 2DEG portion. The third nitride semiconductor layer 8b preferably has a composition represented by $Al_ZGa_{1-Z}N$ ($0<Z\leq 1$, $X<Z\leq Y$). The thickness $t_3$ of the third nitride semiconductor layer 8b is preferably in a range of 15 nm to 30 nm. A ratio $t_1/t_3$ of the thickness $t_1$ of the second nitride semiconductor layer 8a to the thickness $t_3$ of the third nitride semiconductor layer 8b is preferably in a range of 1 to 1.7. Preferably, the distance $d_1$ between the drain electrode 32 and the gate electrode 34 and the length $d_3$ of the third nitride semiconductor layer in the direction parallel to the substrate plane between the drain electrode 32 and the gate electrode 34 have a difference in a range represented by $0.5~\mu m \leq d_1 - d_3 \leq 2~\mu m$.

This second embodiment can provide a semiconductor device that prevents current oscillation from occurring during switching and prevents the trapping of electrons from increasing ON-state resistance.

Third Embodiment

A semiconductor device according to a third embodiment includes a substrate, a first nitride semiconductor layer disposed on the substrate, a second nitride semiconductor layer disposed on the first nitride semiconductor layer and having a larger bandgap than the first nitride semiconductor layer, a source electrode disposed on the second nitride semiconductor layer, a drain electrode disposed on the second nitride semiconductor layer, a gate electrode disposed between the source electrode and the drain electrode, and a halogen-containing nitride semiconductor layer (the third nitride semiconductor layer) disposed in the second nitride semiconductor layer between the drain electrode and the gate electrode and disposed on a surface of the second nitride semiconductor layer while spaced from the drain electrode, the halogen-containing nitride semiconductor layer containing a halogen group element.

The description aspects of the third embodiment which overlap the first and second embodiments will not be repeated.

Figure 5:
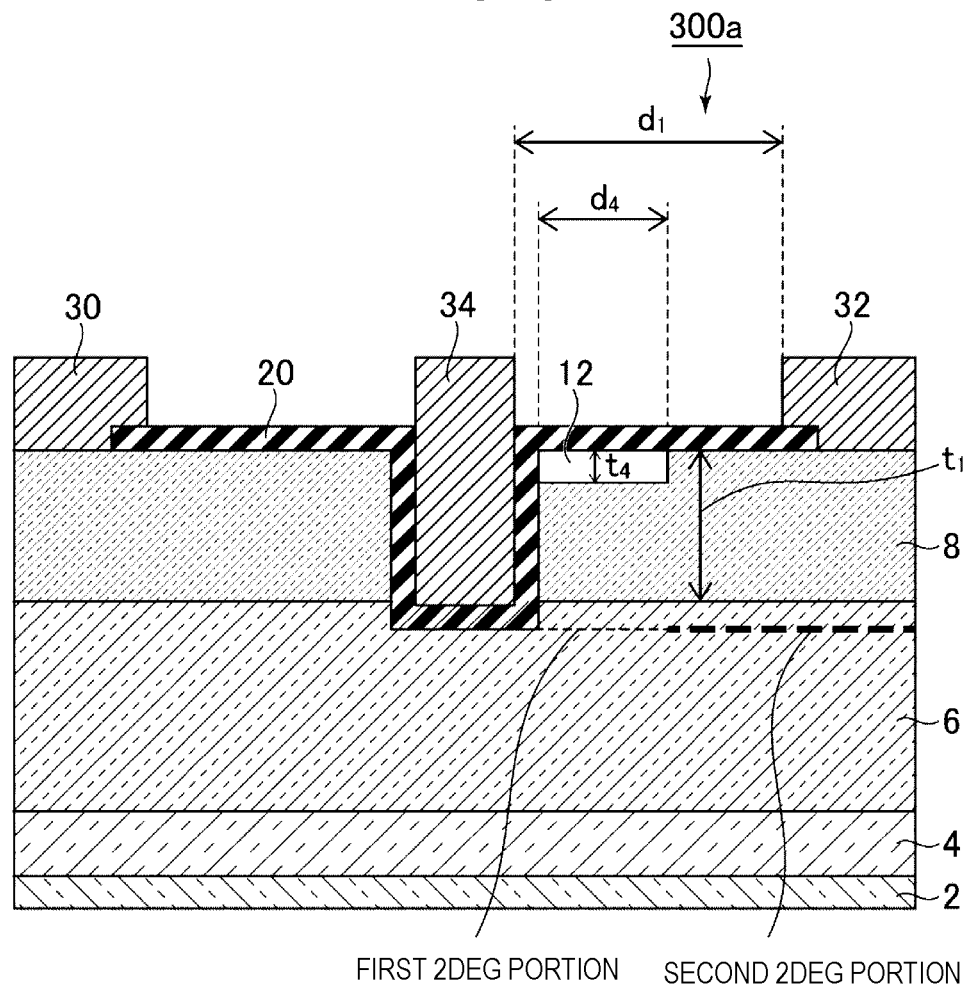
FIG. 5 is a schematic cross-sectional view of a semiconductor device according to a third embodiment.

FIG. 5 is a schematic cross-sectional view of a semiconductor device 300a according to the third embodiment.

A halogen-containing nitride semiconductor layer 12 is disposed in the second nitride semiconductor layer 8 between the drain electrode 32 and the gate electrode 34 and disposed on a surface of the second nitride semiconductor layer 8 while being spaced from the drain electrode 32. The halogen-containing nitride semiconductor layer 12 contains a halogen group element. Here, the halogen group element is fluorine (F), chlorine (Cl), bromine (Br), or iodine (I). The halogen-containing nitride semiconductor layer 12 in this third embodiment is formed by ion implantation of the halogen group element or by performing selective epitaxial growth in an atmosphere containing the halogen group element, and subsequently performing thermal post treatment.

Preferably, a concentration of the halogen group element in the halogen-containing nitride semiconductor layer 12 is $1 \times 10^{12}~cm^{-2}$ or more and $1 \times 10^{13}~cm^{-2}$ or less. A ratio $t_1/t_4$ for the thickness $t_1$ of the second nitride semiconductor layer 8 to a thickness $t_4$ of the halogen-containing nitride semiconductor layer 12 is preferably in a range of 1.5 to and 10. Preferably, the distance $d_1$ between the drain electrode 32 and the gate electrode 34 and a length $d_4$ of the halogen-containing nitride semiconductor layer 12 in the direction parallel to the substrate plane have a difference in a range represented by $0.5~\mu m \leq d_1 - d_4 \leq 2~\mu m$.

FIG. 6 is a schematic cross-sectional view of a semiconductor device 300b according to another example of the third embodiment. The semiconductor device 300b is substantially the same as the semiconductor device 300a illustrated in FIG. 5 except for a structure of the gate electrode 34 and surrounding elements that is similar to the structure of the semiconductor device 100b illustrated in FIG. 2 and the structure of the semiconductor device 200b illustrated in FIG. 4.

The halogen-containing nitride semiconductor layer 12 is provided to form the first 2DEG portion, which has a lower 2DEG concentration than the second 2DEG portion, in the vicinity of an interface between the first nitride semiconductor layer 6 and the second nitride semiconductor layer 8 below the halogen-containing nitride semiconductor layer 12. In a similar manner to the first and second embodiments, the third embodiment can provide the semiconductor device that prevents current oscillation from occurring during switching and prevents the trapping of electrons from increasing ON-state resistance.

To form the halogen-containing nitride semiconductor layer 12, there is no need to particularly form a nitride semiconductor layer containing a p-type impurity anew nor to perform selective epitaxial growth to form a stepped portion of a nitride semiconductor layer on the first nitride semiconductor layer 6. In this respect, the semiconductor devices 300a and 300b according to this embodiment are produced relatively easily.

Formation of the first 2DEG portion prevents current oscillation from occurring during switching and prevents trapping of electrons from increasing ON-state resistance. In order to further improve such preventive effects, a concentration of the halogen group element in the halogen-containing nitride semiconductor layer 12 is preferably $1 \times 10^{12}~cm^{-2}$ or more and $1 \times 10^{13}~cm^{-2}$ or less. A ratio $t_1/t_4$ of the thickness $t_1$ of the second nitride semiconductor layer 8 to a thickness $t_4$ of the halogen-containing nitride semiconductor layer 12 is preferably in a range of 1.5 to 10. Preferably, the distance $d_1$ between the drain electrode 32 and the gate electrode 34 and a length $d_4$ of the halogen-containing nitride semiconductor layer 12 in the direction parallel to the substrate plane have a difference in a range represented by $0.5\ \mu m \leq d_1 - d_4 \leq 2\ \mu m$.

This third embodiment can provide the semiconductor device that prevents current oscillation from occurring during switching and prevents the trapping of electrons from increasing ON-state resistance.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions, and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
   a first nitride semiconductor layer on a substrate;
   a source electrode on the first nitride semiconductor layer;
   a drain electrode on the first nitride semiconductor layer;
   a gate electrode between the source electrode and the drain electrode;
   a second nitride semiconductor region between the first nitride semiconductor layer and the drain electrode and being a material having a larger bandgap than the first nitride semiconductor layer;
   a third nitride semiconductor region directly on the first nitride semiconductor layer, a lateral position of the third nitride semiconductor region being between a lateral position of a drain-side edge of the gate electrode and a lateral position of a gate-side edge of the drain electrode, a lateral surface of third nitride semiconductor region directly contacting the second nitride semiconductor region, the third nitride semiconductor region being a material having a bandgap larger than the first nitride semiconductor layer and less than or equal to the material of the second nitride semiconductor region; and
   a fourth nitride semiconductor region between the first nitride semiconductor layer and the source electrode and being a material having a larger bandgap than the first nitride semiconductor layer and the material of the third nitride semiconductor region, wherein
   the gate electrode is between the third nitride semiconductor region and the fourth nitride semiconductor region in a direction substantially parallel to a plane of the substrate.

2. The semiconductor device according claim 1, wherein when a width $d_3$ of the third nitride semiconductor region in the direction substantially parallel to the plane of the substrate is subtracted from a shortest distance $d_1$ between the drain electrode and the gate electrode, the difference is within a range of 0.5 μm to 2 μm, endpoint inclusive.

3. The semiconductor device according claim 1, wherein a ratio $t_1/t_3$ for a thickness $t_1$ of the second nitride semiconductor region from the first nitride semiconductor layer to an uppermost surface and a thickness $t_3$ of the third nitride semiconductor region from the first nitride semiconductor layer to an uppermost surface is between 1 and 1.7, endpoint inclusive.

4. The semiconductor device according to claim 1, further comprising:
   an insulating film covering the third nitride semiconductor region, an upper surface of the second nitride semiconductor region, and an upper surface of the fourth nitride semiconductor region, wherein
   the insulating film is between the gate electrode and the first nitride semiconductor layer,
   the insulating film is between the gate electrode and the third nitride semiconductor region, and
   the insulating film is between the gate electrode and the fourth nitride semiconductor region.

5. The semiconductor device according to claim 4, wherein a portion of the insulating film is between a portion of the source electrode and the fourth nitride semiconductor region.

6. The semiconductor device according to claim 5, wherein another portion of the insulating film is between a portion of the drain electrode and the second nitride semiconductor region.

7. The semiconductor device according to claim 4, wherein the insulating film is silicon nitride.

8. The semiconductor device according to claim 4, wherein the insulating film is silicon oxide.

9. The semiconductor device according to claim 1, wherein the second nitride semiconductor region and the fourth nitride semiconductor region are each an aluminum gallium nitride material.

10. The semiconductor device according to claim 1, wherein the gate electrode extends to a position level with a lowermost surface of the third nitride semiconductor region.

11. The semiconductor device according to claim 1, wherein the second and fourth nitride semiconductor regions are each undoped aluminum gallium nitride.

12. The semiconductor device according to claim 1, wherein the second nitride semiconductor region is an aluminum gallium nitride doped with silicon.

13. The semiconductor device according to claim 1, wherein
   the first nitride semiconductor layer comprises a material with a formula $Al_XGa_{1-X}N$, where X satisfies $0 \leq X < 1$,
   the material of the second nitride semiconductor region comprises a material with a formula $Al_YGa_{1-Y}N$, where Y satisfies $0 < Y \leq 1$ and $X < Y$, and
   the material of the third nitride semiconductor region comprises a material with a formula $Al_ZGa_{1-Z}N$, where Z satisfies $0 < Z \leq 1$ and $X < Z < Y$.

14. The semiconductor device according to claim 1, wherein the third nitride semiconductor region has thickness between 15 nm to 30 nm, endpoint inclusive.

15. The semiconductor device according to claim 1, wherein the source electrode, the drain electrode, and the gate electrode are metal.

16. The semiconductor device according to claim 1, wherein the substrate is sapphire.

17. The semiconductor device according to claim 1, further comprising:
   a buffer layer between the substrate and the first nitride semiconductor layer.

18. The semiconductor device according to claim 1, wherein a distance between the source electrode and the drain electrode in the direction substantially parallel to the substrate is between 5 microns and 30 microns, end point inclusive.

19. The semiconductor device according to claim 1, further comprising:
   an insulating film covering the third nitride semiconductor region, an upper surface of the second nitride semiconductor region, and an upper surface of the fourth nitride semiconductor region.

20. The semiconductor device according to claim 19, wherein the insulating film is continuous from the source electrode to the drain electrode.

\* \* \* \* \*